United States Patent [19]
Fujita

[11] Patent Number: 5,994,894
[45] Date of Patent: Nov. 30, 1999

[54] TESTBOARD FOR IC TESTER

[75] Inventor: Yoshihiro Fujita, Tokyo, Japan

[73] Assignee: Ando Electric Co., Ltd., Tokyo, Japan

[21] Appl. No.: 08/897,110

[22] Filed: Jul. 18, 1997

[30] Foreign Application Priority Data

Jul. 31, 1996 [JP] Japan ..................... 8-219393

[51] Int. Cl.⁶ .............................................. G01R 31/02
[52] U.S. Cl. .......................................... 324/158.1; 439/61
[58] Field of Search .................... 439/65, 61; 324/158.1, 324/755

[56] References Cited

U.S. PATENT DOCUMENTS

| 5,646,522 | 7/1997 | Etemadpour et al. | ............... 324/158.1 |
| 5,747,994 | 5/1998 | Suga | ..................... 324/158.1 |

Primary Examiner—Neil Abrams
Attorney, Agent, or Firm—Darby Darby

[57] ABSTRACT

This testboard for an IC tester comprises second connector 4, housing 7, cable 9, and socket board 12; and second connector 4 is mounted on base card 5 and engages first connectors 3 of a plurality of pincards 1. Housing 7 is mounted on base card 5 on the opposite side to second connector 4, holds third connector 8 which is fitted into second connector 4, while being arranged orthogonally to the above-mentioned plurality of pincards 1; and there is one housing 7 for each device 14 being tested. Cable 9 is connected to third connector 8 of housing 7 and to fourth connector 10 at the socket board 12 end. Fifth connector 11 which engages fourth connector 10 and IC socket 13 for the above-mentioned device 14 being tested are mounted on socket board 12.

11 Claims, 6 Drawing Sheets

TESTBOARD FOR IC TESTER

BACKGROUND OF THE INVENTION

1. Technical Field of the Invention

The present invention relates to a testboard for an IC tester and, in particular, to a testboard for an IC tester which connects an IC tester and an auto-handler.

2. Background Art

Testboards for IC testers conventionally comprise a base unit and a DUT unit as shown in FIGS. 7~9 and are used to connect an IC tester and an auto-handler. FIG. 7 is a perspective view of the conventional art and FIG. 8 is a diagram showing the view from the direction of arrow VIII of FIG. 7. FIG. 9 is a diagram showing the view from the direction of arrow IX of FIG. 7.

In FIG. 7A, the test circuit 2 for testing the device 14 being tested is loaded onto pincard 1. A single device 14 being tested corresponds to two pincards 1, and the test is conducted by means of assigning signals to each of the pins PIN1~PINn of the device 14 being tested using the IC tester of a configuration comprising the timing generation circuit t1, pattern generating circuit t2, format control circuit t3 and driver comparator circuit t4 shown in FIG. 7B.

A first connector 3 which is connected to test circuit 2 mounted on pincard 1, and first connector 3 is fitted into second connector 4 which is mounted on the bottom surface of base card 5 in the manner indicated by arrow C in FIGS. 8 and 9.

Housing 7 is mounted on base card 5 and third connector 8, which is fitted onto the pins 6 of the above-mentioned second connector 4, is held on housing 7 as shown by the arrow B in FIG. 8 and FIG. 9.

One end of a cable 9 is connected to each third connector 8, and the other end of cable 9 is connected to fourth connector 10. As shown by the arrow A in FIG. 8 and FIG. 9, fourth connector 10 is fitted into a fifth connector 11 which is mounted on socket board 12, and the device 14 which is being tested is mounted on IC socket 13 which is connected to fifth connector 11.

In addition, as shown in FIG. 8 and FIG. 9, a harness 15 is formed by a plurality of cables 9 and housings 7, and a base unit 16 is formed by means of base card 5 and a plurality of harnesses 15. Furthermore, a DUT unit 17 is formed by means of a plurality of socket boards 12.

Then, by means of the above structure, DUT units 17 can be prepared for each type of device 14 being tested corresponding to the type of test, and when changing the type of device 14 being tested, the DUT unit 17 is exchanged by removing the DUT unit 17 from the base unit 16. In addition, when it is not possible to obtain correspondence by means of the above-mentioned method, the connection of the third connector 8 which is held in the-housing 7 with the pins 6 of the second connector 4 can be changed. On the other hand, when maintenance is conducted on pincard 1, base unit 16 can be separated from pincard 1.

In the above-mentioned technical art, for each device 14 being tested there are two housings 7, and there are thirty-two third connectors 8 arranged adjacently in single file on each housing 7. Consequently, when the IC tester has a configuration in which the test circuit 2 corresponding to each device 14 being tested comprises a small number of pincards 1, since completion can be achieved by means of a small number of housings 7, construction of the harness 15 and the base unit 16 is easy, and assembly of the base unit 16 is also simple.

However, when the IC tester has a configuration in which the test circuit 2 corresponding to each device 14 being tested comprises a large number of pincards 1, the number of housings 7 also increases in proportion to the number of pincards 1. Consequently, the number of housings 7 increases, construction of harness 15 and base unit 16 becomes complicated and, furthermore, the assembly of the base unit 16 becomes difficult.

DISCLOSURE OF THE INVENTION

The present invention has an object the provision of a testboard for an IC tester for which the construction of the harness and base unit is easy and the assembly of the base unit is simple.

In order to solve the above-mentioned problem, the present invention is a testboard for an IC tester which connects an IC tester and an auto handler and which lies between the device 14 being tested and a plurality of pincards 1 on which the test circuit 2 for testing the device 14 being tested is mounted. The testboard for an IC tester of the present invention comprises (A) a second connector 4 which engages a first connector 3 of the above-mentioned plurality of pincards 1 and which is mounted on a base card 5; (B) a single housing 7 for each individual device 14 being tested, this housing 7 is mounted on base card 5 on the opposite side to second connector 4, holds third connector 8 which engages second connector 4, and is arranged orthogonally on the above mentioned plurality of pincards 1; (C) cable 9 which connects third connector 8 of housing 7 and fourth connector 10 at the socket board 12 end; and (D) socket board 12 on which fifth connector 11 which engages fourth connector 10 and IC socket 13 for the above-mentioned device 14 being tested are mounted.

Consequently, by means of the present invention, due to the arrangement of housing 7 of harness 15 orthogonally on a plurality of pincards 1, one housing 7 is sufficient for one device 14 being tested, and construction of harness 15 and base unit 16 is easy and the assembly of base unit 16 is simplified.

BEST MODE FOR CARRYING OUT THE INVENTION

Embodiment 1

Figure 1A:
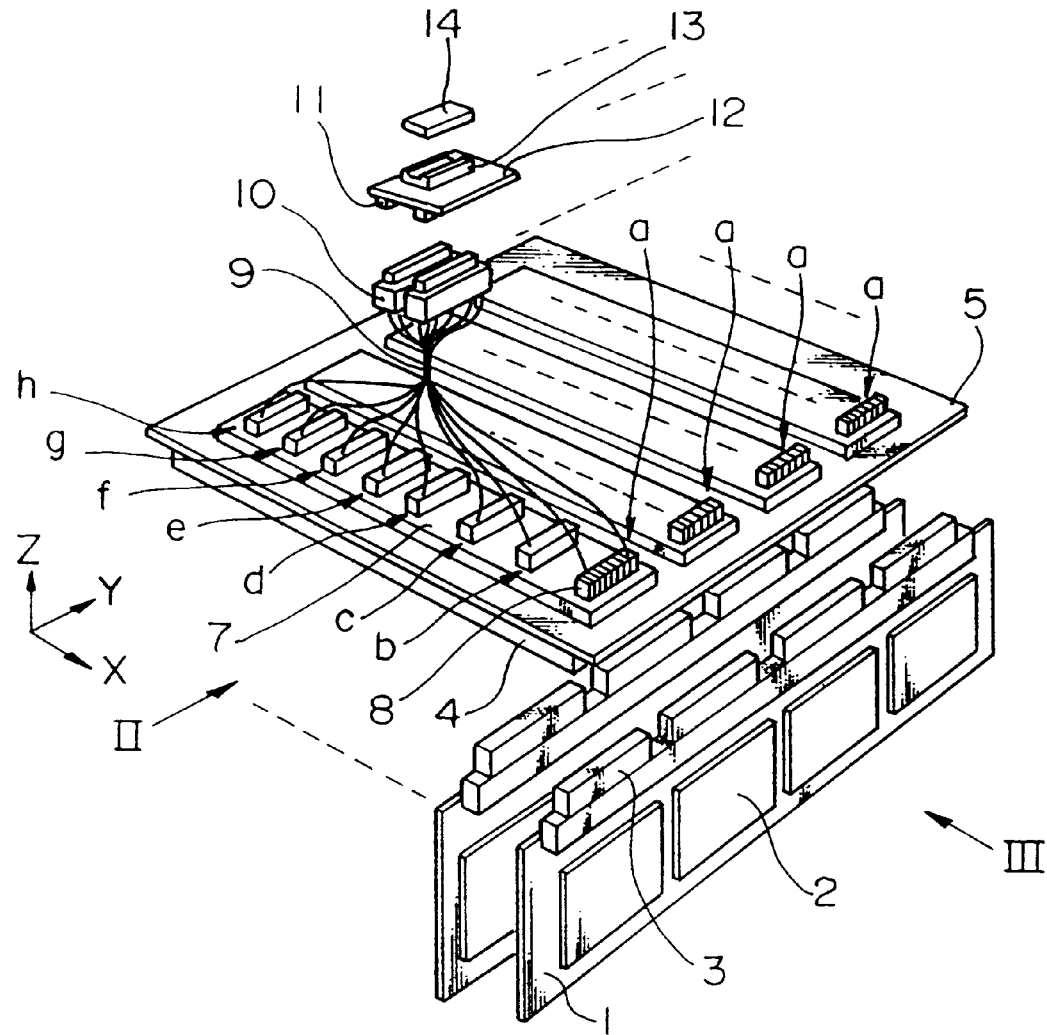
FIG. 1A is a perspective view showing Embodiment 1 of the present,invention.
Figure 1B:
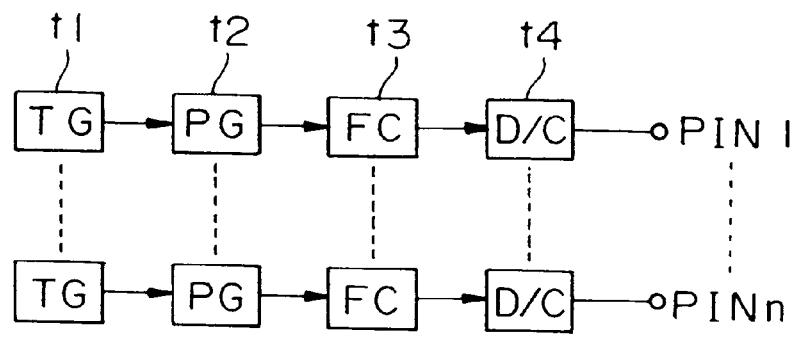
FIG. 1B is a diagram showing a part of the circuit structure according to Embodiment 1 of the present invention.
Figure 2:
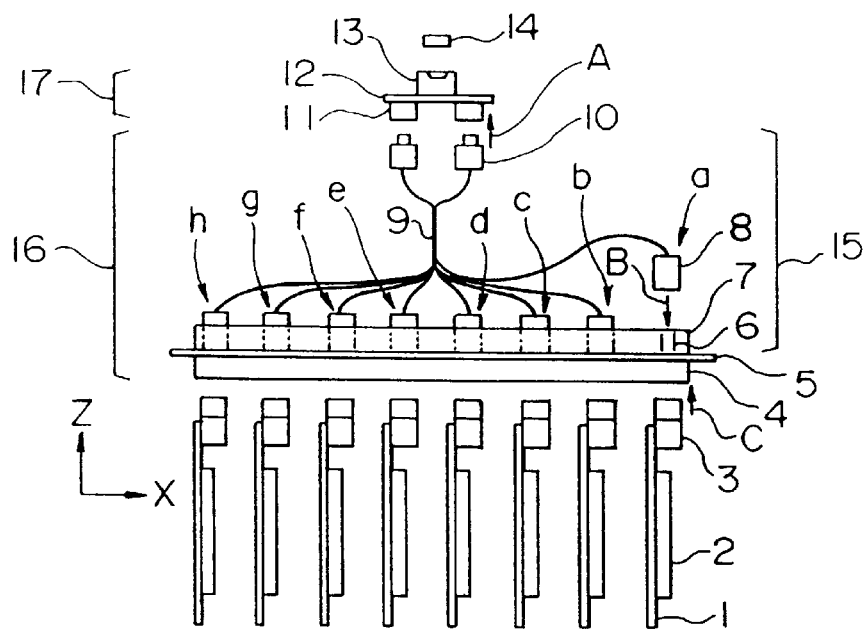
FIG. 2 is a diagram showing Embodiment 1 from the direction indicates by the arrow II in FIG. 1A and 1B.
Figure 3:
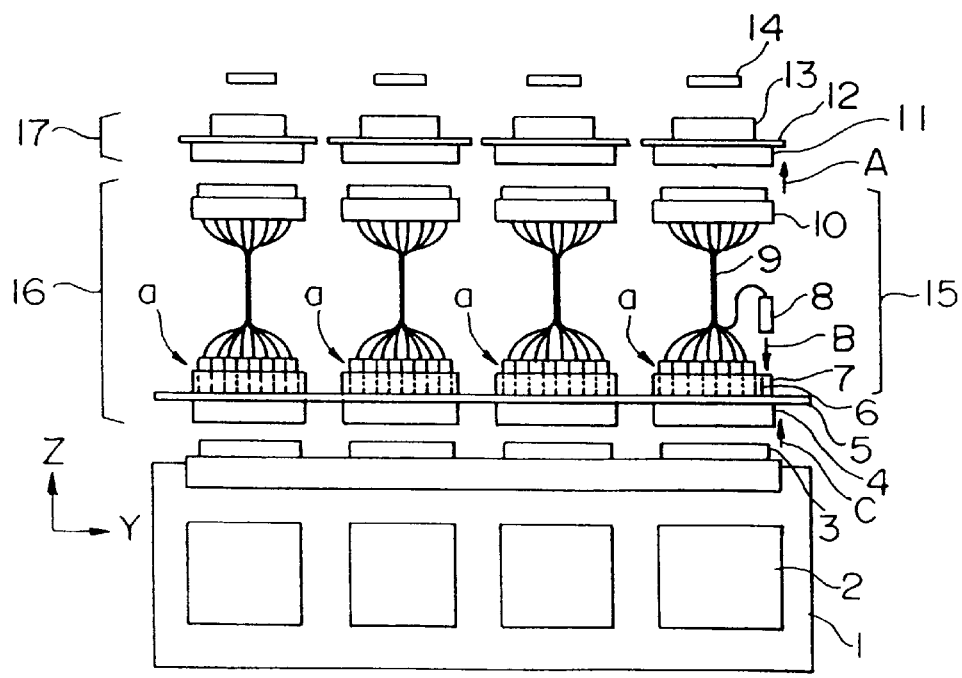
FIG. 3 is a diagram showing Embodiment 1 from the direction indicated by the arrow III in FIG. 1A and 1B.

FIG. 1 is a perspective view showing a first Embodiment of the present invention, FIG. 2 is a diagram of the first Embodiment as seen from the direction of arrow II in FIG. 1A and 1B, and FIG. 3 is a diagram of the first Embodiment as seen from the direction of arrow III in FIG. 1A and 1B.

In FIG. 1A, four test circuits 2 for testing a device 14 being tested are loaded on pincard 1, and eight pincards 1 correspond to one device 14 being tested (FIG. 2). A test is conducted by means of directly transmitting a signal to each of the pins PIN1~PINn of the device 14 being tested using an IC tester having a configuration which comprises a timing generation circuit t1, a pattern generation circuit t2, a format control circuit t3, and a driver comparator circuit t4 as shown in FIG. 1B.

In addition, one first connector 3 which is connected to test circuit 2 is mounted on each pincard 1 as shown in the figure. Consequently, as shown in FIG. 2, in the X-axis direction, there are eight first connectors 3 corresponding to each of the eight pincards 1, and, as shown in FIG. 3, in the Y-axis direction, there is one first connector 3 corresponding to each of the pincards 1, as a result there is a total of eight first connectors 3 for each pincard 1.

Next, for each individual device 14 being tested, a single second connector 4 orthogonally engages the eight first connectors 3 which are arranged in the X-axis direction, in the manner indicated by the arrow C in FIG. 2 and FIG. 3. In other words, for eight first connectors 3, there is one second connector 4 per device 14 being tested.

Here, the second connector 4 is mounted on the lower surface of base card 5, and, for each device 14 being tested, a single housing 7 is mounted parallel to the second connector 4 on the upper surface of base card 5. Furthermore, third connector 8 which engages pin 6 of the second connector 4 is held on housing 7 as shown by arrow B in FIG. 2 and FIG. 3.

In other words, in addition to holding third connector 8 which engages pin 6 of second connector 4, housing 7 is arranged orthogonally to the above-mentioned eight pincards 1 on which first connector 3 is mounted, and there is only one housing 7 for each individual device 14 being tested.

In addition, the third connectors 8 which are held by this housing 7 are formed into groups of eight as indicated by the letters a~h in FIG. 1 and FIG. 2. These eight groups a~h of third connectors 8 are parallel to the first connectors 3 of pincard 1 and are arranged separated by intervals.

Figure 8:
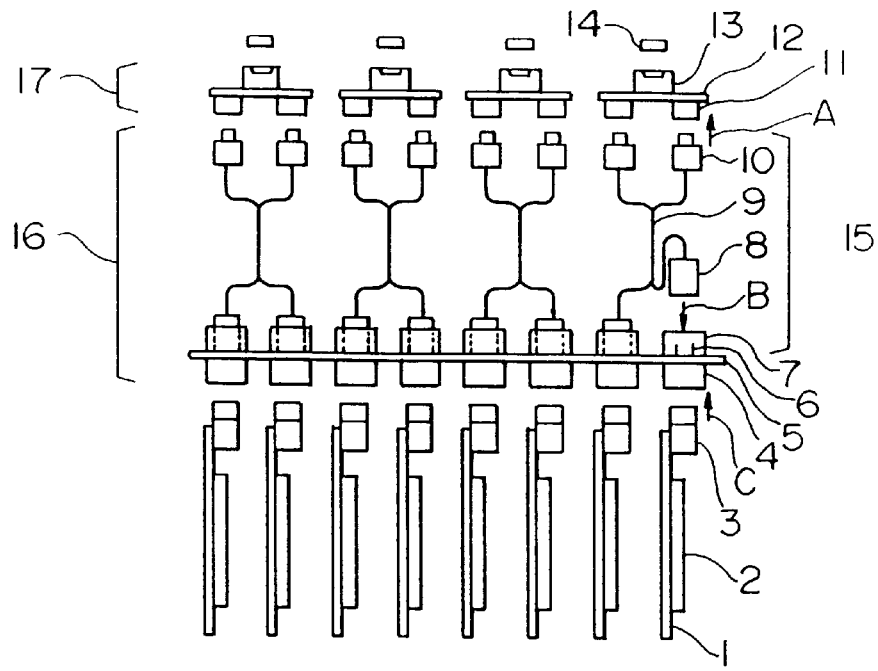
FIG. 8 is a diagram showing the conventional art from the direction indicate by the arrow VIII in FIG. 7A and 7B.

In other words, there are a total of sixty-four third connectors 8 individually arranged on housing 7; 8 in the X-axis direction as shown in FIG. 1 and FIG. 2, and 8 in the Y-axis direction as shown in FIG. 1 and FIG. 3.

Furthermore, the third connectors 8 of the eight groups a~h, arranged separated by intervals and parallel to the first connectors 3 of pincard 1, are each connected to one end of a cable 9, and the other end of cable 9 is connected to fourth connector 10 which is arranged in the upward direction of the Z-axis. As indicated by arrow A in FIG. 2 and FIG. 3, fourth connector 10 is inserted into fifth connector 11 which is mounted on socket board 12, and the device 14 being tested is mounted on IC socket 13 which is connected to the fifth connector 11.

In addition, as shown in FIG. 2 and FIG. 3, harness 15 comprises a plurality of cables 9 and housing 7, and base unit 16 comprises base card 5 and a plurality of harnesses 15. In addition, DUT unit 17 comprises a plurality of socket board 12.

By means of this structure, a DUT unit 17 can be prepared for each type of device 14 being tested in correspondence with a variety of tests, and when exchanging the type of device 14 being tested, the DUT unit 17 is separated from base unit 16 and the DUT unit 17 exchanged. In addition, when correspondence cannot be obtained by the above-mentioned method, the connection of third connector 8, which is held on housing 7, to pin 6 of second connector 4 is changed and, by means of this, the connection between the device 14 being tested and test circuit 2 is changed. On the other hand, when maintenance of pincard 1 is conducted, pincard 1 can be separated from base unit 16.

Embodiment 2

Figure 4:
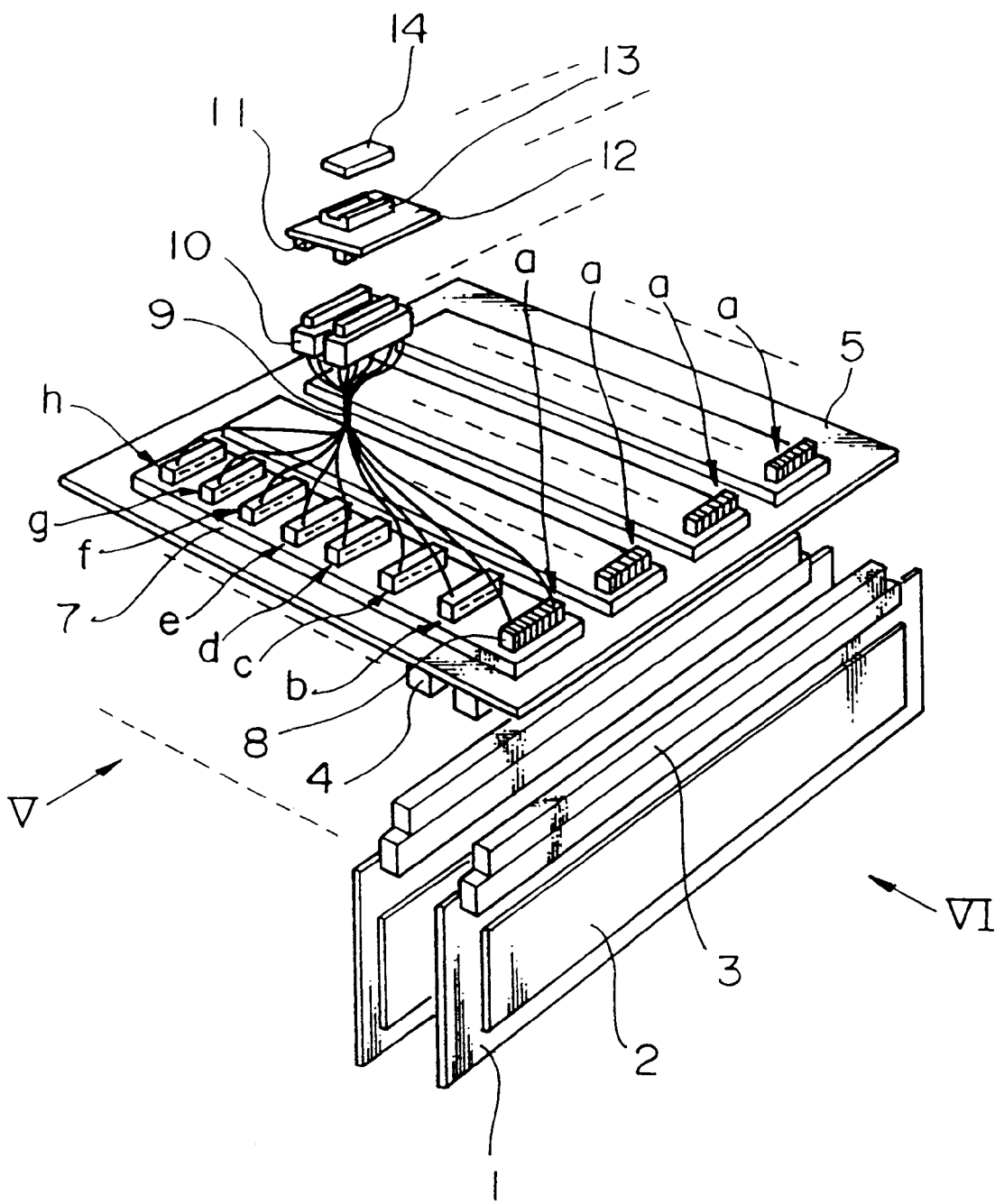
FIG. 4 is a perspective view showing Embodiment 2 of the present invention.
Figure 5:
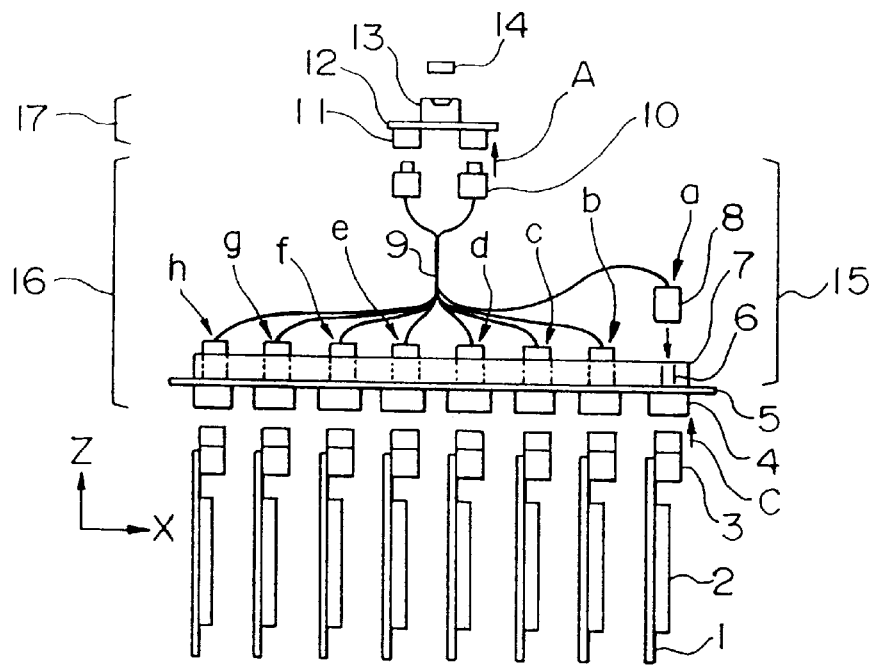
FIG. 5 is a diagram showing Embodiment 2 from the direction indicated by the arrow V in FIG. 4.
Figure 6:
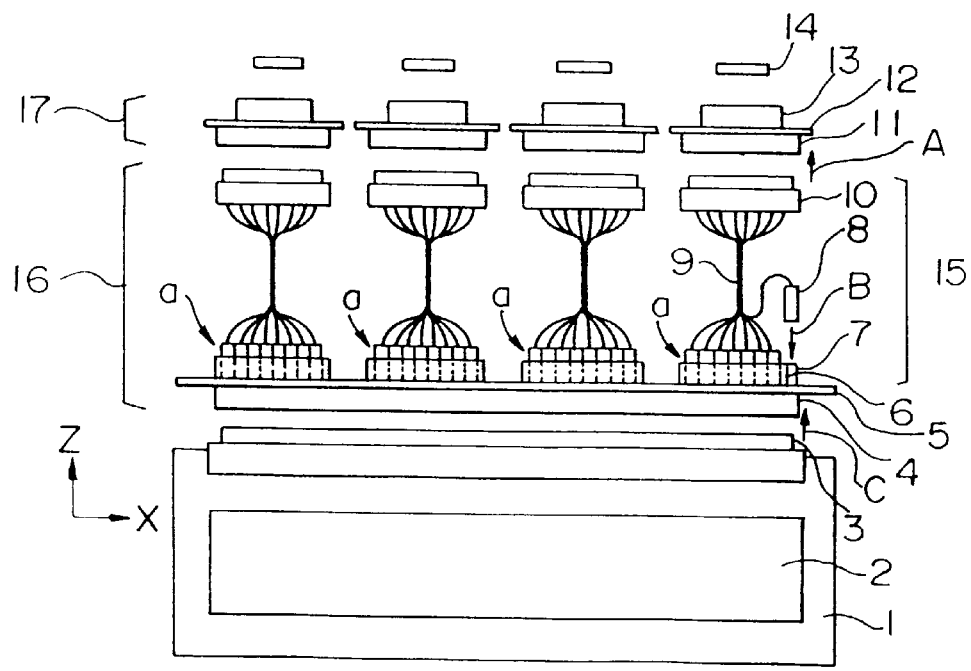
FIG. 6 is a diagram showing Embodiment 2 from the direction indicated by the arrow VI in FIG. 4.

FIG. 4 is a perspective view showing a second Embodiment of the present invention, FIG. 5 is a diagram of the second Embodiment as seen from the direction of arrow V in FIG. 4, and FIG. 6 is a diagram of the second Embodiment as seen from the direction of arrow VI in FIG. 4.

A difference between this Embodiment and the first Embodiment (FIG. 1 to FIG. 3) is that for ever device being tested, there are eight second connectors 4 arranged parallel to eight first connectors 3 which are mounted on pincard 1.

More specifically, as shown in FIG. 4 to FIG. 6, a single test circuit 2 is loaded on pincard 1, and there is one first connectors 3 which is connected to this test circuit 2 mounted on each pincard 1, therefore, there is a total of eight first connectors in the arrangement. In addition, eight second connectors 4 which are mounted on the lower surface of base card 5 are arranged parallel to these eight first connectors 3.

In the following, the operation of the present invention having the above-mentioned structures will be explained.

As shown in FIGS. 1~6, in the present invention, for each single device 14 being tested, there is only one housing 7 on base card 5. Consequently, there are only eight of the third connectors 8, which are held on this single housing 7, formed into one group, and the eight groups a~h of the third connectors 8 are arranged separated by intervals.

Figure 7A:
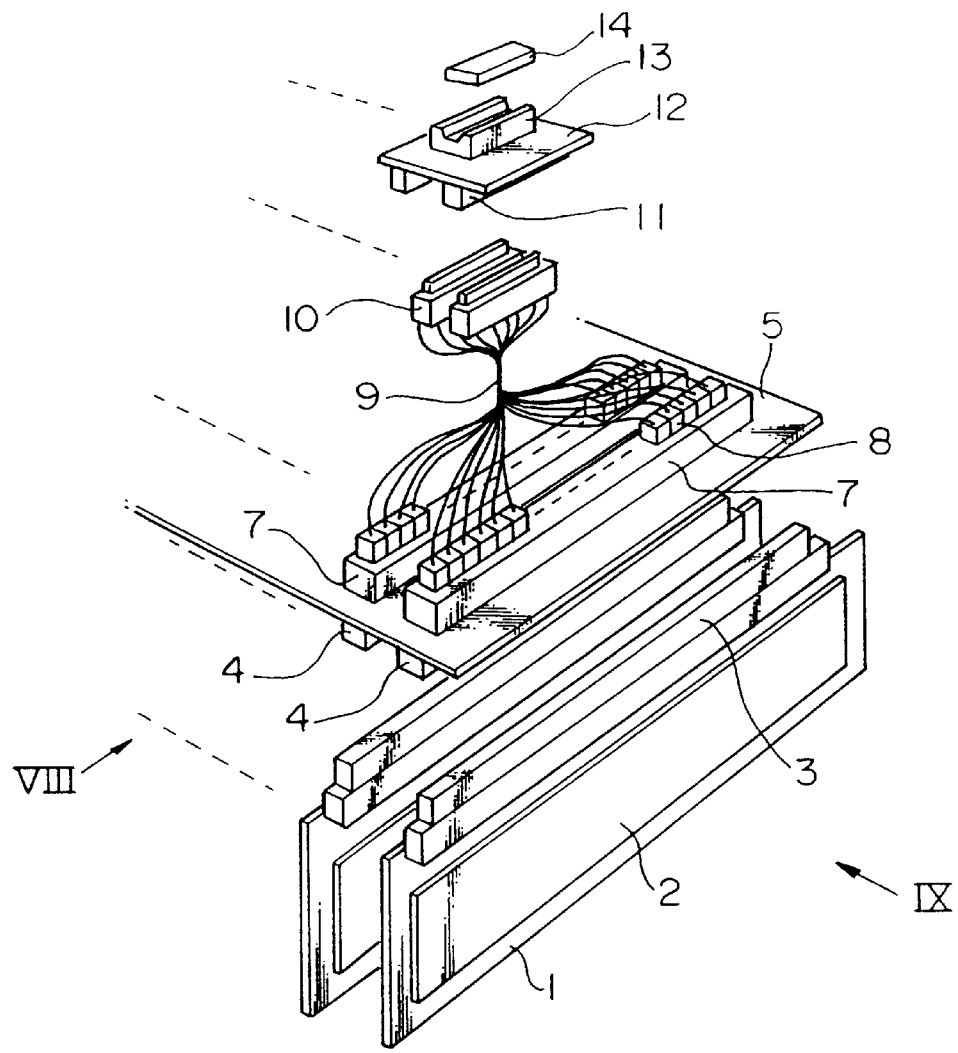
FIG. 7A is a perspective view showing conventional art.
Figure 7B:
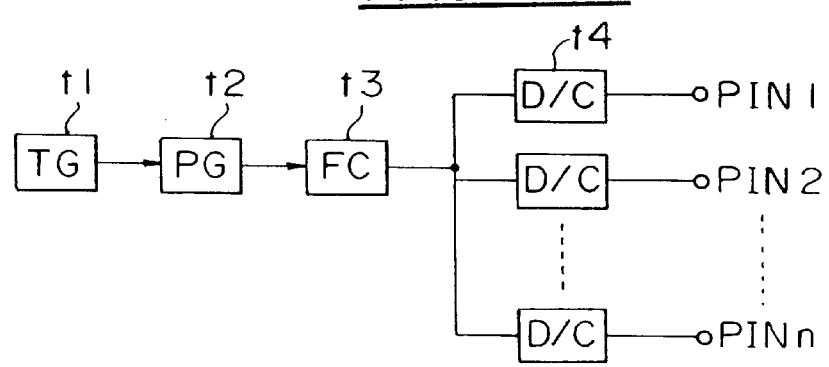
FIG. 7B is a diagram showing a part of the circuit structure according to the conventional art.
Figure 9:
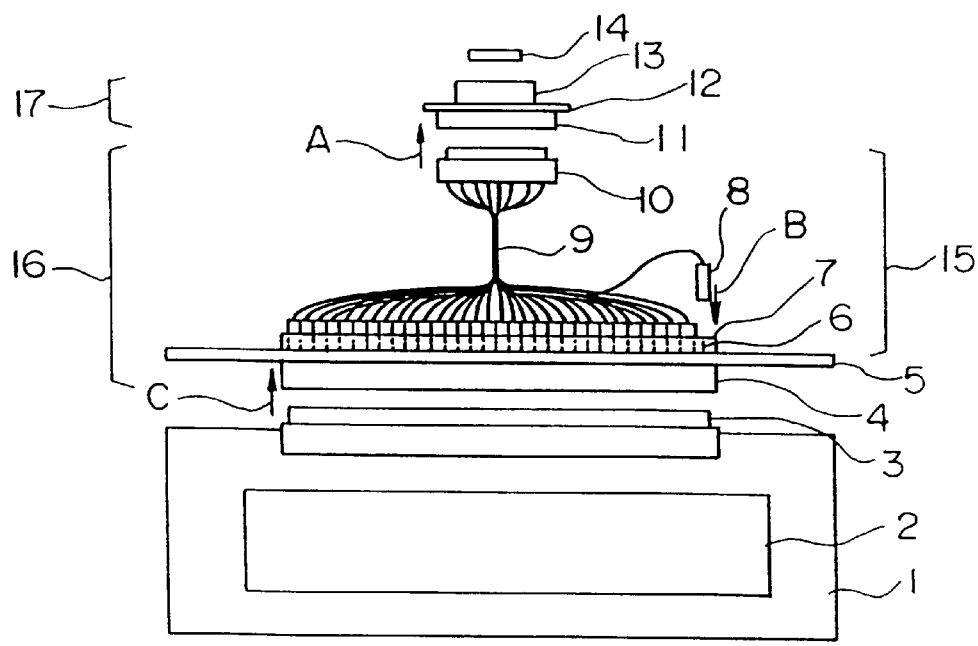
FIG. 9 is a diagram showing the conventional art from the direction indicated by the arrow IX in FIG. 7A and 7B.

In contrast, as shown in FIG. 7 and FIG. 8, conventionally, there have been two housings 7 for each single device 14 being tested, moreover, as shown in FIG. 9, for each housing 7, there have been thirty-two third connectors 8 in a long adjoining arrangement.

Therefore, by means of the present invention, even when test circuit 2 for each device 14 being tested comprises a large number of pincards 1, with one housing 7 for each single device 14 being tested, it is possible to conduct the wiring of cables 9 very easily and quickly by means of changing the connection of third connector 8 to pin 6 of the second connector 4.

In other words, when changing the connection with pin 6 of second connector 4, compared with the conventional art in which disconnection and connection of thirty-two adjoining third connectors 8 on each housing 7 of which there are two for each device 14 being tested is necessary, it is much easier, by means of the present invention, to disconnect and connect one group of eight third connectors 8 on one housing 7 of which there is one for every individual device 14 being tested and the wiring of cable 9 can be done more easily and quickly without error.

In particular, in Embodiment 1, in addition to housing 7, there is also one second connector 4 for each single device 14 being tested. Therefore, the construction of harness 15 which comprises cable 9 and housing 7 is easy, and the construction of base unit 16 which comprises harness 15 and base card 5 is easy while assembly is also simple.

Furthermore, there is only one housing 7 for each individual device 14 being tested, and as a whole, since there are four housings 7 for every eight pincards 1, there is also the result of a reduction in the number of parts.

What is claimed is:

1. A testboard for an IC tester for use between a device being tested and a plurality of pincards arranged in parallel, each pincard having a plurality of test circuits with a corresponding first connector, a device being tested to be adapted to receive a test signal from a test circuit of at least several of the plurality of pincards for testing the device, said testboard comprising:

a base card having a group of a plurality of second connectors thereon each second connector of the group of second connectors for connecting to a respective first connector of a pincard of the plurality of pincards;

a housing corresponding to the device being tested mounted on said base card orthogonally to the plurality of pincards and having a plurality of third connectors each electrically connected to a corresponding second connector of a said group of a plurality of said second connectors;

a cable comprising a plurality of wires with one end connected to said plurality of third connectors of said housing and a fourth connector at the other ends of said wires; and a socket board having mounted thereon a fifth connector for connection to said cable fourth connector and an IC socket to which the device being tested is connected.

2. A testboard for an IC tester according to claim 1 for use with eight pincards; a plurality of spaced housings each having a group of eight of said third connectors each arranged parallel to the first connector of the test circuit of the pincard to which it is to be connected.

3. A testboard for an IC tester according to claim 2, wherein a said third connector connected to and disconnected from a said housing and a connection to a pin the corresponding second connector is changeable.

4. A testboard for an IC tester according to claim 1 for testing a plurality of devices wherein there is a respective group of said second connectors corresponding to each of the devices being tested; and said groups of second connectors are arranged orthogonally to the first connectors of the pincards.

5. A testboard for an IC tester according to claim 1, for testing a plurality of devices and for use with eight pincards; wherein there are eight groups of said second connectors, one group for each of the devices being tested; and said second connectors of a group are arranged parallel to the first connector of the test circuit of each of the plurality of pincards corresponding to the device being tested.

6. A testboard for an IC tester as in claim 1, wherein there are a plurality of said housings on said testboard arranged in parallel, each housing having a plurality of third connectors each electrically connected to corresponding second connectors, said plurality of housings being arranged transverse to the plurality of pincards.

7. A testboard for a IC tester according to claim 4 for testing a plurality of devices, wherein there are a plurality of said housings each corresponding to a group of said second connectors, one said housing corresponding to each of the devices being tested.

8. A testboard for an IC tester as in claim 7 further comprising:

a cable comprising a plurality of wires with one end connected to said plurality of third connectors of each said housing and a fourth connector at the other ends of said wires; and a socket board having mounted thereon a fifth connector for connection to a said cable fourth connector and an IC socket to which the device being tested is connected.

9. An IC tester for testing a plurality of IC devices comprising:

a plurality of pincards arranged in parallel, each pincard having a plurality of test circuits with a corresponding first connector, a device being tested to receive a test signal from a test circuit of each of the plurality of pincards for testing the respective device;

a base card having a plurality of second connectors thereon each for connecting to a respective first connector of each of the plurality of pincards;

a housing corresponding to the device being tested located on said base card orthogonally to the plurality of pincards and having a plurality of third connectors each to be electrically connected to the second connectors that are to be connected to the first connector of each of the plurality of pincards for the test circuit for a device to be tested;

a cable comprising a plurality of wires with one end connected to said plurality of third connectors of said housing and a fourth connector at the other ends of said wires; and a socket board having mounted thereon a fifth connector for connection to said cable fourth connector and an IC socket to which the device being tested is connected.

10. An IC tester according to claim 9 for testing a plurality of devices, wherein there are a plurality of said housings each with a group of said second connectors, one group of said second connectors for each of the devices being tested.

11. An IC tester as in claim 10 further comprising:

a cable comprising a plurality of wires with one end connected to said plurality of second connectors of a said housing and a fourth connector at the other ends of said plurality of wires; and a socket board having mounted thereon a fifth connector for connection to said cable fourth connector and an IC socket to which the device being tested is connected.

* * * * *